(12) United States Patent
Albers

(10) Patent No.: US 9,054,223 B2
(45) Date of Patent: Jun. 9, 2015

(54) VARISTOR IN BASE FOR MEMS MICROPHONES

(71) Applicant: Knowles Electronics, LLC, Itasca, IL (US)

(72) Inventor: John J. Albers, Chicago, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 0 days.

(21) Appl. No.: 14/295,728

(22) Filed: Jun. 4, 2014

(65) Prior Publication Data

US 2014/0367809 A1 Dec. 18, 2014

Related U.S. Application Data

(60) Provisional application No. 61/835,782, filed on Jun. 17, 2013.

(51) Int. Cl.
*H01L 29/84* (2006.01)
*B81B 7/00* (2006.01)
*B81C 1/00* (2006.01)
*H01L 23/525* (2006.01)

(52) U.S. Cl.
CPC .............. *H01L 29/84* (2013.01); *B81B 7/0012* (2013.01); *B81C 1/00341* (2013.01); *H01L 23/5252* (2013.01); *H01L 23/5256* (2013.01)

(58) Field of Classification Search
CPC . H01L 29/84; H01L 23/5256; H01L 23/5252; B81B 7/0012
See application file for complete search history.

(56) References Cited

U.S. PATENT DOCUMENTS

| | | | | |
|---|---|---|---|---|
| 5,235,135 A * | 8/1993 | Knecht et al. | .................. | 174/539 |
| 6,501,107 B1 * | 12/2002 | Sinclair et al. | ................ | 257/209 |
| 7,368,311 B2 * | 5/2008 | Tilmans et al. | .................. | 438/48 |
| 8,464,571 B1 * | 6/2013 | Sparks et al. | .................. | 73/1.38 |
| 2005/0089180 A1 | 4/2005 | Saeki et al. | | |
| 2006/0185429 A1 | 8/2006 | Liu et al. | | |
| 2007/0196943 A1 | 8/2007 | Kumst | | |
| 2007/0201259 A1 * | 8/2007 | Van Gorsel | ..................... | 365/96 |
| 2009/0116669 A1 | 5/2009 | Song | | |
| 2011/0032642 A1 * | 2/2011 | Kautzky et al. | ............ | 360/246.2 |
| 2014/0002178 A1 * | 1/2014 | Teh et al. | ...................... | 327/525 |

FOREIGN PATENT DOCUMENTS

JP 2006109264 A 4/2006

OTHER PUBLICATIONS

International Search Report and Written Opinion for PCT/US2014/041910 dated Oct. 2, 2014 (9 pages).

* cited by examiner

*Primary Examiner* — Michele Fan
(74) *Attorney, Agent, or Firm* — Fitch, Even, Tabin & Flannery LLP

(57) ABSTRACT

A micro electro mechanical system (MEMS) apparatus includes a substrate. The substrate includes a first surface and a second surface. The first surface and the second surface are on opposing sides of the substrate. A programming contact pad is disposed on the second surface of the substrate. A MEMS device is disposed on the first surface of the substrate. An integrated circuit is disposed on the first surface of the substrate and electrically connected to the MEMS device and the contact pad. An anti-fuse region is coupled to the pad and to ground. When the anti-fuse region is not fused, a first electrical path exists from the programming contact pad to the integrated circuit. When the anti-fuse region is fused, a second electrical path is created from the programming contact pad to ground and the first electrical path is no longer available for programming purposes.

10 Claims, 6 Drawing Sheets

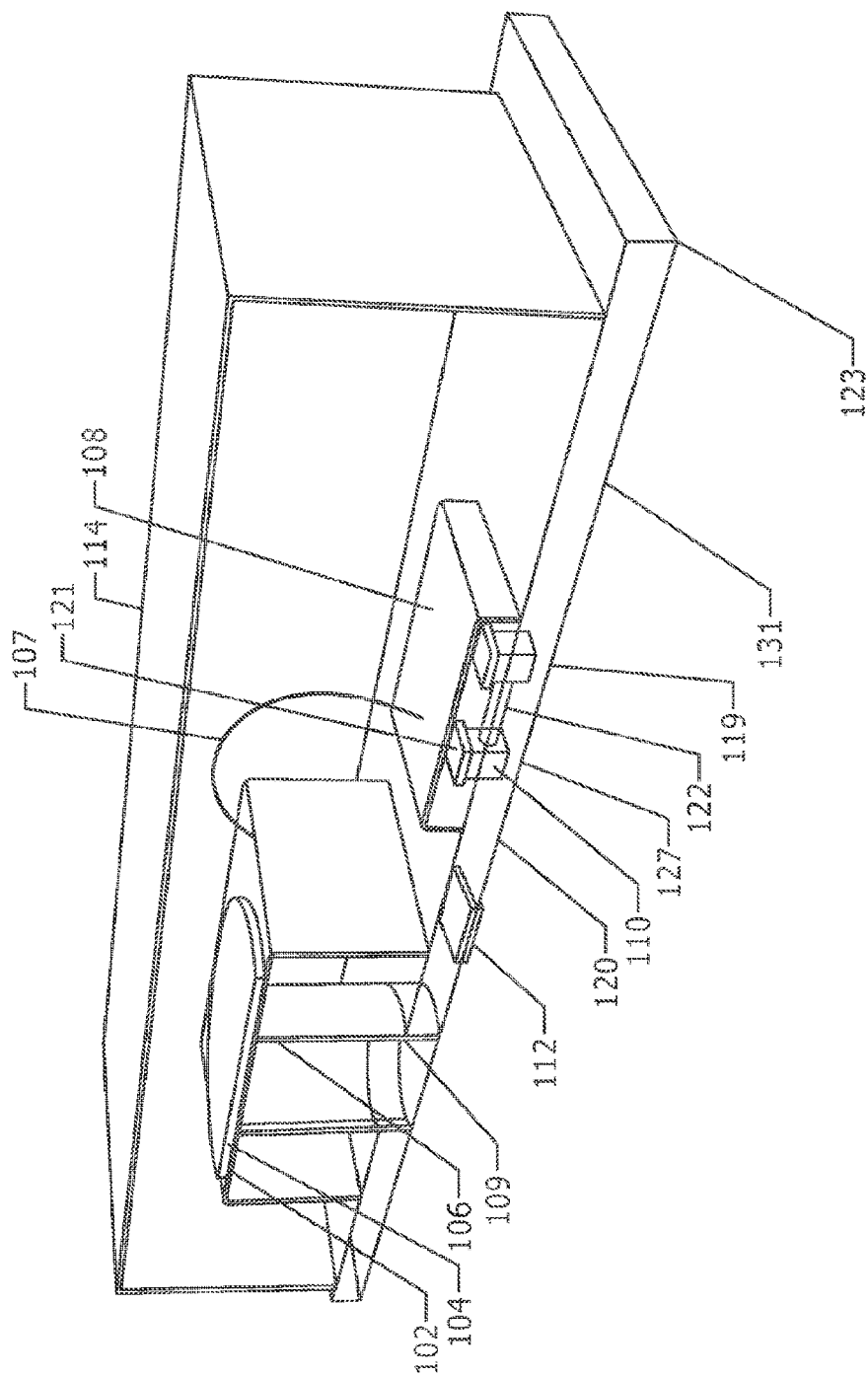

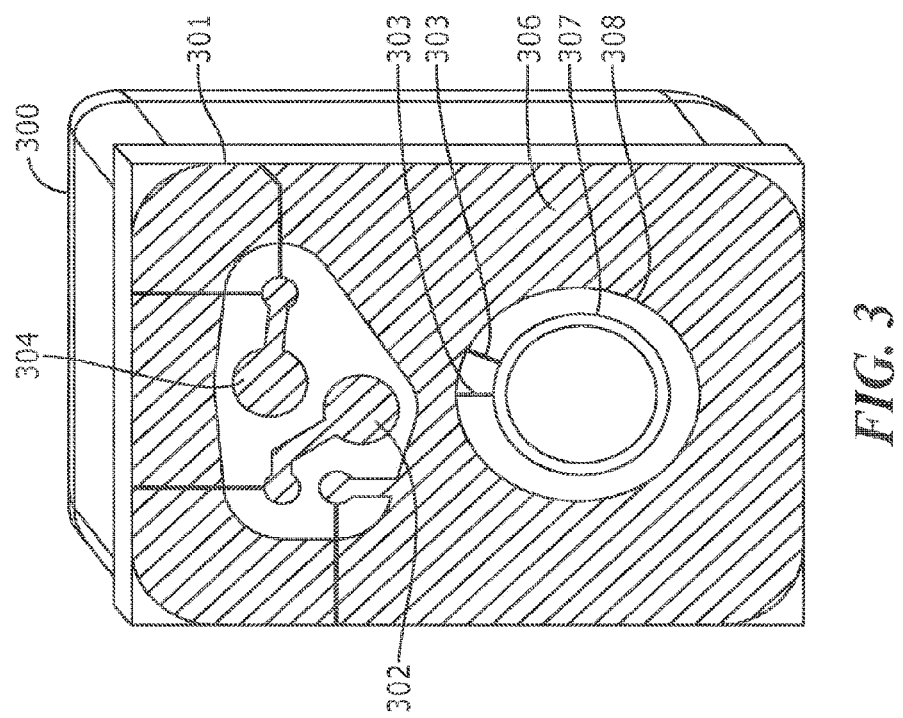

VARISTOR IN BASE FOR MEMS MICROPHONES

CROSS REFERENCE TO RELATED APPLICATIONS

This patent claims benefit under 35 U.S.C. §119 (e) to United States Provisional Application No. 61835782 entitled "Varistor in Base for MEMS Microphones" filed Jun. 17, 2013, the content of which is incorporated herein by reference in its entirety.

TECHNICAL FIELD

This application relates to MicroElectroMechanicalSystem (MEMS) devices and, more specifically, to programming these devices.

BACKGROUND OF THE INVENTION

MicroElectroMechanical System (MEMS) devices include microphones and receivers to mention two examples. In these devices, different electrical components are disposed together within a housing unit. For example, a receiver typically includes a coil, magnets, and stack, among other components and these components are housed within the receiver assembly. Other types of acoustic devices may include other types of components.

Acoustic devices sometimes include integrated circuits such as application specific integrated circuit (ASICs). Often, these devices need to be programmed. Programming is typically accomplished by the use of external pads that are often located on the bottom of a MEMS device. These pads couple to the integrated circuit through conductive traces or other conductive members passing through the substrate. To program a device, a user usually couples a programming device to these pads, and then programs the integrated circuit. Once the programming is accomplished, the user simply removes the device.

There are some problems associated with these previous approaches. It is typically not desirable to allow the device to be re-programmed after the initial programming is accomplished. In this case, an unauthorized user might simply connect another programming device to the pads, and then re-program the device. Unauthorized programming of an ASIC, for example, may cause the ASIC to function improperly and, in fact, may prevent the entire MEMS device from functioning properly. This, in turn, may have consequences that range from minor performance issues concerning the degradation of system performance to safety issues when the MEMS device is disposed in a critical piece of electronic equipment.

Previous systems and approaches have not provided a way to adequately prevent the unauthorized re-programming of integrated circuits in MEMS devices. In fact, previous systems and approaches are completely silent as to overcoming these problems.

BRIEF DESCRIPTION OF THE DRAWINGS

For a more complete understanding of the disclosure, reference should be made to the following detailed description and accompanying drawings wherein:

FIGS. 1A, 1B, and 1C comprise diagrams of a MEMS device according to various embodiments of the present invention;

FIG. 3 comprises a block diagram of a MEMS device according to various embodiments of the present invention;

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

In the present approaches, electrical pads or regions are provided on the substrate of a MEMS device. One or more of the pads or regions is used for programming an integrated circuit. After the initial programming is accomplished, an anti-fuse region is fused (or in some way actuated), and this action provides a shorted connection between the programming pad to ground. Consequently, after initial programming is accomplished, the programming capability of the device is de-activated and cannot be re-activated. In so doing, unauthorized re-programming of the ASIC is prevented.

Figure 1A:
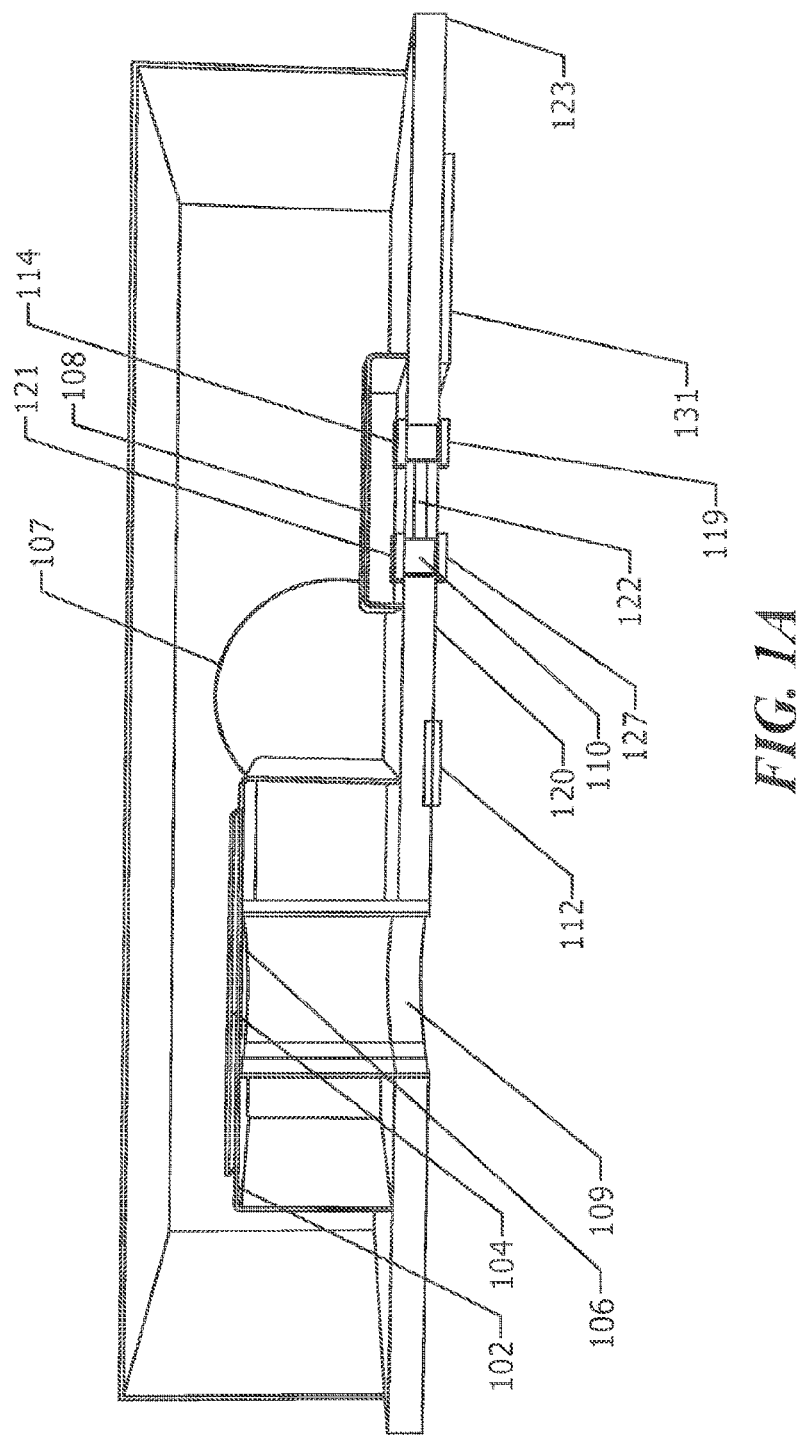
Figure 1B:
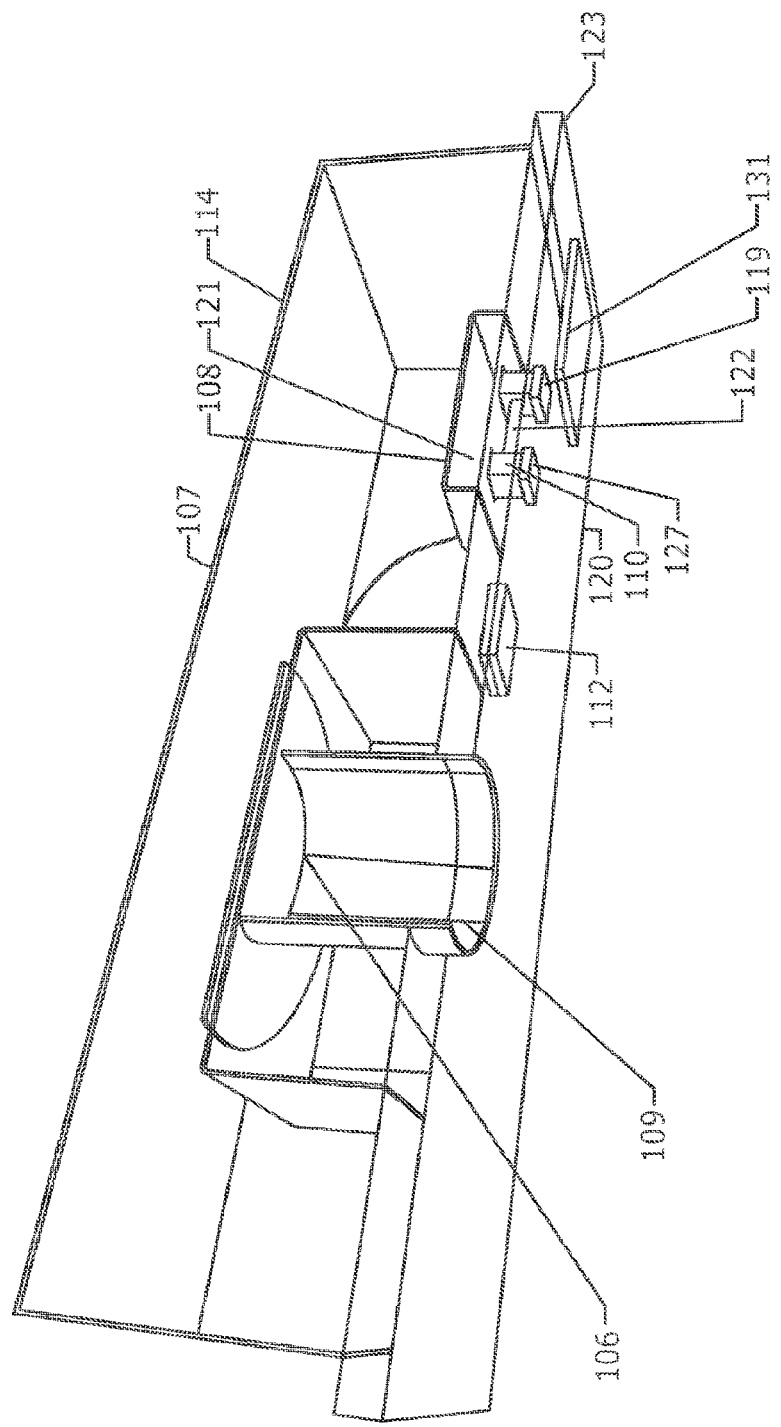
Figure 2:
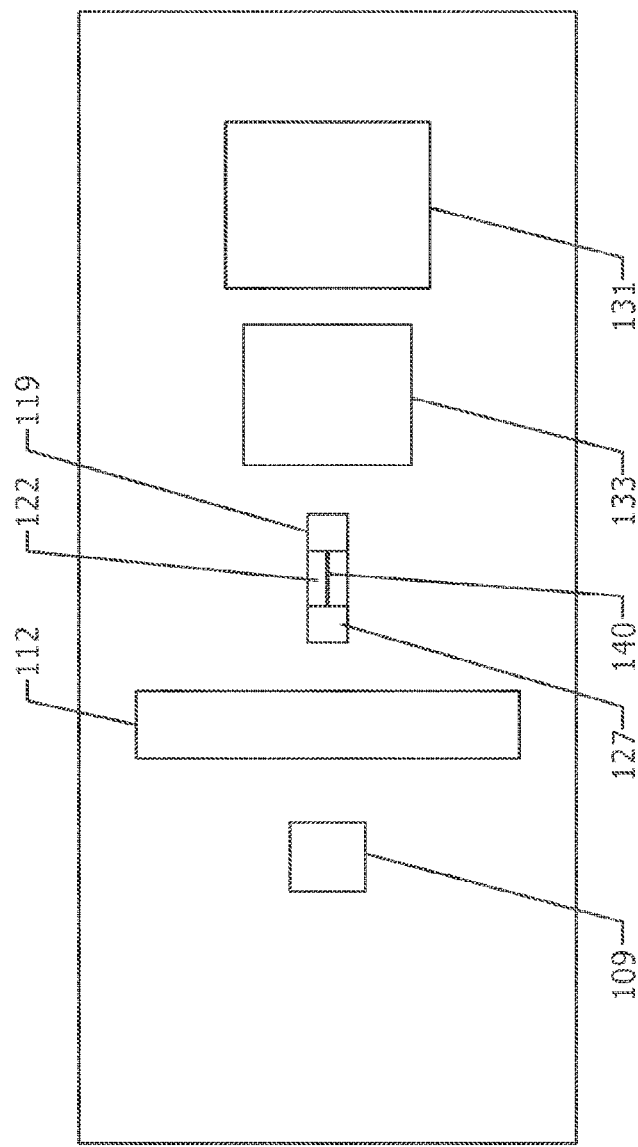
FIG. 2 comprises a block diagram of shorting the programming functionality of integrated circuits in MEMS devices according to various embodiments of the present invention.

Referring now to FIG. 1A, 1B, 1C and FIG. 2, a MEMS microphone 100 is described. The MEMS microphone 100 includes a MEMS device 102 (including a diaphragm 104 and a back plate 106). The MEMS microphone 102 is coupled by wires 107 to an application specific integrated circuit (ASIC) 108 and both are disposed on a substrate 123. The device shown in FIGS. 1 and 2 is a bottom port microphone. However, it will be appreciated that the approaches described herein can be used with top port devices as well (i.e., a device where the port extends through the lid).

The ASIC 108 may provide a variety of functions such as voltage amplification. The ASIC 108 has a first connection 110 (e.g., a conductive trace or other conductor) between a first connector 114 on the ASIC 108 and a first pad 119 on a bottom surface of the substrate 123. A second connector 121 on the ASIC 108 couples to a second connector 120 (e.g., a conductive trace or other conductor) and then to a ground plane 112. The ground plane 112 is also coupled to a ground pad 127 on the bottom surface of the substrate 123.

A power pad 131 is coupled to the ASIC 108 and allows power to be supplied to the ASIC 108. An output pad 133 also couples to the ASIC 108 and allows the output of the ASIC 108 to be received by other electronic devices.

In operation, sound energy is received through a port 109. The sound energy causes the diaphragm 104 to move, and this creates a change in electrical potential with the back plate 106, thereby creating an electrical signal. The electrical signal is processed by the ASIC 108 and after processing may be sent to the output pad 133 on the bottom of the microphone 100 for use by other electronic equipment. For example, the microphone 100 may be disposed in an electronic device such as a cellular telephone or a personal computer. The microphone 100 may be disposed in other types of devices as well.

The bottom surface of the substrate 123 includes an anti-fuse region 122 that extends between the pad 119 and the pad 127. The anti-fuse region may be a magnesium oxide varistor. Other materials may also be used. When being programmed, the anti-fuse region 122 is not fused and the pads 119 and 127 are electrically isolated and disconnected from each other. A programmer initially couples a programming device to the pad 119 and then programs the ASIC 108.

In some aspects after the initial programming has been accomplished, the anti-fuse region 122 is shorted (e.g., by burning), creating an electrical short 140 (i.e., an electrical conduction path) between the first pads 119 and 127. Consequently, future re-programming of the ASIC is impossible since the ASIC 108 is now shorted to ground.

Referring now to FIG. 3, a MEMS arrangement seen by a user (e.g., a customer) is shown. It will be appreciated that the example of FIG. 3 is a top port device, but that the approaches described herein can also be used with bottom port devices. This arrangement shows a bottom surface 301 of a substrate of a microphone 300 and the electrical connections visible to the customer on the bottom surface 301 of the MEMS microphone 300. The bottom surface 301 includes a power pad 302, an output pad 304, a ground region 306, a programming pad 307, and an anti-fuse (e.g., magnesium oxide varistor) region 308. It will be appreciated that these electrical contact points are electrically coupled to various electronic devices such as the ASIC shown in FIG. 1. For simplicity, the ASIC and electrical paths to the ASIC are not shown in FIG. 3.

The power pad 302 electrically couples power to the ASIC. The output pad 304 is an output of the ASIC. A customer electronic device may couple to this pad. For example, the microphone 300 may be disposed in an electronic device such as a cellular telephone or a personal computer and electrical components of these devices may couple to the MEMS microphone. The microphone 300 may be disposed in other types of devices as well.

During initial programming, a customer couples a programming device to the programming pad 307. This step may be accomplished at the manufacturing facility. However, in some situations it may be allowed to occur at a customer location. After the coupling of the programming device to the MEMS microphone 300 is accomplished, programming of the ASIC occurs. For example, various computer instructions, parameters, or values may be programmed in the ASIC using the programming pad 307 during the programming of the MEMS microphone 300.

After the initial programming is accomplished, it is desired to eliminate the ability of future or unauthorized users to re-program the device. In these regards, shorts 303 are created between the ground region 306 and the programming pad 307. The shorts 303 are conductive electrical paths.

More specifically, the ASIC also includes an anti-fuse region 305. The anti-fuse region 308 is, for example, a magnesium oxide varistor (MOV) region. The MOV material is burned up by, for example, application of a high voltage to create paths 303 between the ground region 306 and the programming pad 307. Consequently, after the initial programming is accomplished, future re-programming of the ASIC is impossible since the programming pins of the ASIC are now shorted to ground.

Figure 5:
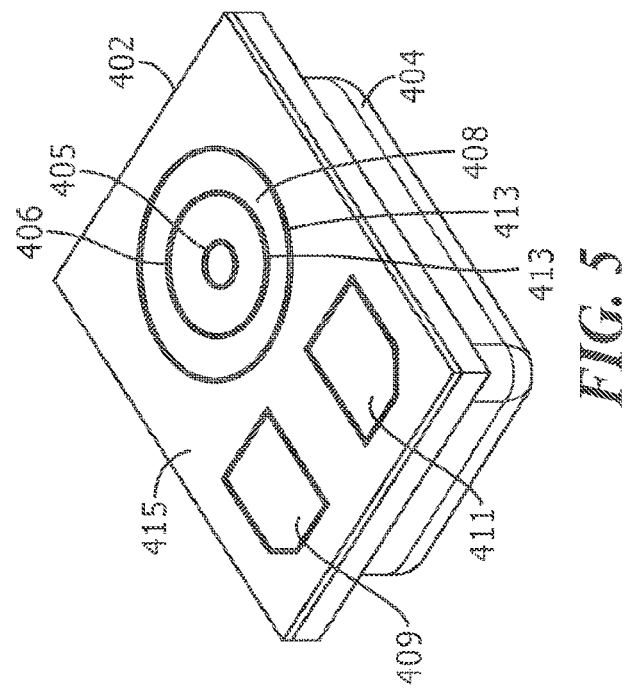
FIG. 5 comprises a perspective view of the bottom of a MEMS device according to various embodiments of the present invention.
Figure 4:
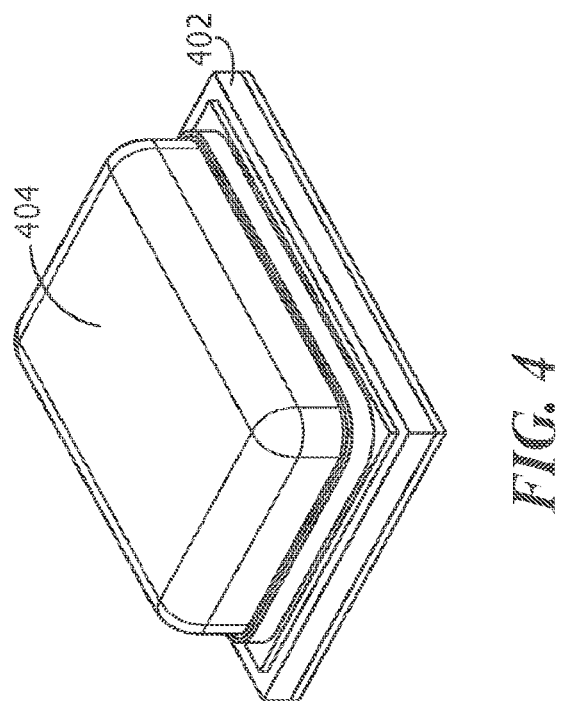
FIG. 4 comprises a perspective view of a MEMS device according to various embodiments of the present invention.

Referring now to FIGS. 4 and 5, another example of a MEMS microphone is shown. The MEMS assembly 400 includes a substrate 402 and a cover 404. The assembly 400 includes an ASIC disposed in the assembly and not shown. The substrate 402 includes a programming ring 406 and magnesium oxide varistor (MOV) region 408. A port 405 extends through the substrate 402 into the interior of the assembly 400 allowing sound to enter the assembly. As shown, the device in FIG. 4 and FIG. 5 is a bottom port device. However, it will be appreciated that the approaches described herein can also be applied to top port devices.

The MOV region 408 is adjacent to a ground region 415. During initial programming, a customer couples a programming device to the programming ring 406. The programming ring 406 electrical couples to an ASIC (not shown in FIG. 4 or 5). After coupling is accomplished, programming of the ASIC occurs. For example, various computer instructions, parameters and values may be programmed into the ASIC. The substrate 402 also includes an output pad 409 that couples to the ASIC providing an output for the ASIC. The substrate 402 additionally includes a power pad 411 that couples to the ASIC and allows power to be supplied to the ASIC.

After initial programming is accomplished, it is typically desired to eliminate the ability of an unauthorized user to re-program the ASIC. In these regards, a high voltage is applied to the MOV region 408. The application of the high voltage creates one or more shorts 413 (conductive paths) between the programming ring 406 and the ground region 415. Thus, the ASIC cannot be programmed because the programming ring 406 (which couples to a programming pin on the AISC) is now grounded.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A micro electro mechanical system (MEMS) apparatus, comprising:
   a substrate with a first surface and a second surface, the first surface and the second surface being on opposing sides of the substrate;
   a programming contact pad disposed on the second surface of the substrate;
   a MEMS device disposed on the first surface of the substrate;
   an integrated circuit disposed on the first surface of the substrate and electrically connected to the MEMS device and the programming contact pad;
   an anti-fuse region coupled to the programming contact pad and to ground;
   such that when the anti-fuse region is not fused a first electrical path exists from the programming contact pad to the integrated circuit;
   such that when the anti-fuse region is fused, a second electrical path is created from the programming contact pad to ground and the first electrical path is no longer available for programming purposes.

2. The MEMS apparatus of claim 1, wherein the fusing is permanent.

3. The MEMS apparatus of claim 1, wherein the integrated circuit is an application specific integrated circuit (ASIC) that performs voltage amplification.

4. The MEMS apparatus of claim 1, wherein the fusing is performed by burning.

5. The MEMS apparatus of claim 1, wherein the anti-fused region comprises a magnesium oxide varistor.

6. A method of programming micro electro mechanical system (MEMS) apparatus, the MEMS apparatus including a substrate with a first surface and a second surface, a programming contact pad disposed on the second surface of the substrate, the first surface and the second surface being on opposing sides of the substrate, and a MEMS device disposed on the first surface of the substrate and an integrated circuit disposed on the first surface of the substrate and connected to the MEMS device and the programming contact pad, and an anti-fuse region coupled to the programming contact pad and to ground, the method comprising:

initially programming the integrated circuit using a first electrical path that exists from the programming contact pad to the integrated circuit;

fusing the anti-fuse region such that when the anti-fuse region is fused, a second electrical path is created from the programming contact pad to ground and the first electrical path is no longer available for programming purposes.

7. The method of claim 6, wherein the fusing is permanent.

8. The method of claim 6, wherein the integrated circuit is an application specific integrated circuit (ASIC) that performs voltage amplification.

9. The method of claim 6, wherein the fusing is performed by burning.

10. The method of claim 6, wherein the anti-fused region comprises a magnesium oxide varistor.

\* \* \* \* \*